United States Patent
Pekarich et al.

(10) Patent No.: US 6,614,858 B1
(45) Date of Patent: Sep. 2, 2003

(54) LIMITING RANGE OF EXTRINSIC INFORMATION FOR ITERATIVE DECODING

(75) Inventors: Steven P. Pekarich, Slatington, PA (US); Xiao-An Wang, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/506,019

(22) Filed: Feb. 17, 2000

(51) Int. Cl.[7] ............................. H03D 1/00; H04L 27/06
(52) U.S. Cl. ........................ 375/340; 375/341; 714/795
(58) Field of Search .................................. 375/340, 341, 375/262, 265; 714/795, 796, 809, 819, 822

(56) References Cited

U.S. PATENT DOCUMENTS 6,487,694 B1 * 11/2002 Rajwa ........................ 714/786

OTHER PUBLICATIONS

A. Ambroze et al. "Practical aspects of iterative decoding", IEEE Proc. Commun. vol. 147, No. 2, Apr. 2000, pp. 69–74.*

Peter Hoeher "New Iterative ("Turbo") Decoding Algorithms", Institute for Communications Technology, German Aerospace Research Establishment (DLR), 1997, pp. 1–8.*

Bartosz Mielczarek et al., "Fast Header Decoding Using Turbo Codes on Rayleigh Fading Channels", Chalmers University of Technology, Goteborg, Sweden.*

* cited by examiner

Primary Examiner—Mohammad H. Ghayour
(74) Attorney, Agent, or Firm—Steve Mendelsohn; Ian M. Hughes

(57) ABSTRACT

An iterative decoder limits the range of extrinsic information used for iterative decoding of an encoded frame of data. The iterative decoder includes two or more separate decoders for decoding a received encoded frame of data. Each decoder employs extrinsic information generated from the soft data generated by another decoder decoding the encoded frame of data. The extrinsic information includes an approximate measure of the probability that a particular transmitted bit received by the iterative decoder is a logic 0 or logic 1. The extrinsic information for the bit originates with one decoder and is used by another decoder as external information about that bit. Implementations of the iterative decoder use saturation values to define the boundaries of the range. The saturation values are selected such that either no or relatively small degradation in BER occurs, and the saturation values also define the width of the binary representation of the extrinsic information.

16 Claims, 2 Drawing Sheets

LIMITING RANGE OF EXTRINSIC INFORMATION FOR ITERATIVE DECODING

BACKGROUND OF THE INVENTION

1. Field of the Invention

The present invention relates to decoding data in communication or recording systems, and, more particularly, to processing of extrinsic information generated during iterative decoding of an encoded frame of data.

2. Description of the Related Art

Multi-dimensional encoding of data with convolutional codes and iterative decoding of the encoded data are employed in many communication systems due to the relatively high coding gain and simple structure of the decoder. The following definitions may be of use to understand the encoding and decoding methods. A set of binary values U is defined in the Galois field-2 (GF(2)) with elements {+1, −1} where −1 is the "null" element under modulo-2 addition. The reliability value, or soft value, L(u) is the log-likelihood ratio of the binary random values in U and is defined as the (natural) log of the ratio of the probability that the random variable U takes on the value u=+1 (logic 1) to the probability that the random variable U takes on the value u=−1 (logic 0). The sign of L(u) is used as a hard decision by a detector or decoder, and the magnitude of L(u) is used as a reliability statistic (value) for the hard decision.

Iterative decoding methods may employ "soft-in, soft-out" decoders for decoding data. In an iterative decoding scheme, encoded data is repetitively decoded by two or more decoding modules until a predetermined number of decoding iterations are complete. In an iterative decoding scheme, the reliability values based on the information are updated at each iteration, utilizing the information extracted from the previous iteration process. Decoding produces a posteriori reliability values for the output, decoded data. The a priori reliability values may either be 0 for the first iteration (since there is no a priori information) or, after the first iteration, extrinsic reliability values for the information bits from a previous iteration. The extrinsic reliability values are values based on indirect information contained in the decoded information bits, and may be generated from the a posteriori reliability values. In general, the a posteriori reliability values and/or the extrinsic reliability values of an iteration are employed as extrinsic information input to a decoder for decoding data during the next iteration.

SUMMARY OF THE INVENTION

The present invention relates to generating thresholds for saturation values to limit the range of values that extrinsic information of an iterative decoder may have while maintaining acceptable system performance measures, such as bit error rate. In accordance with exemplary embodiments, the saturation values reduce the width of the representation (e.g., binary values) used by an iterative decoder when storing and otherwise performing arithmetic operations with the extrinsic information, thereby providing advantages of, for example, reduced circuit power consumption and implementation size.

In accordance with an exemplary embodiment of the present invention, iterative decoding of an encoded frame of data comprises performing a first iteration of decoding the encoded frame of data during which extrinsic information is calculated. The value of the extrinsic information is compared to a saturation value; and, if the value of the extrinsic information exceeds the saturation value, the value of the extrinsic information is set to a value related to the saturation value that is exceeded. The saturation value defines a bound for a range of the values for the extrinsic information based on a confidence measure while maintaining a performance measure for iterative decoding.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 1:
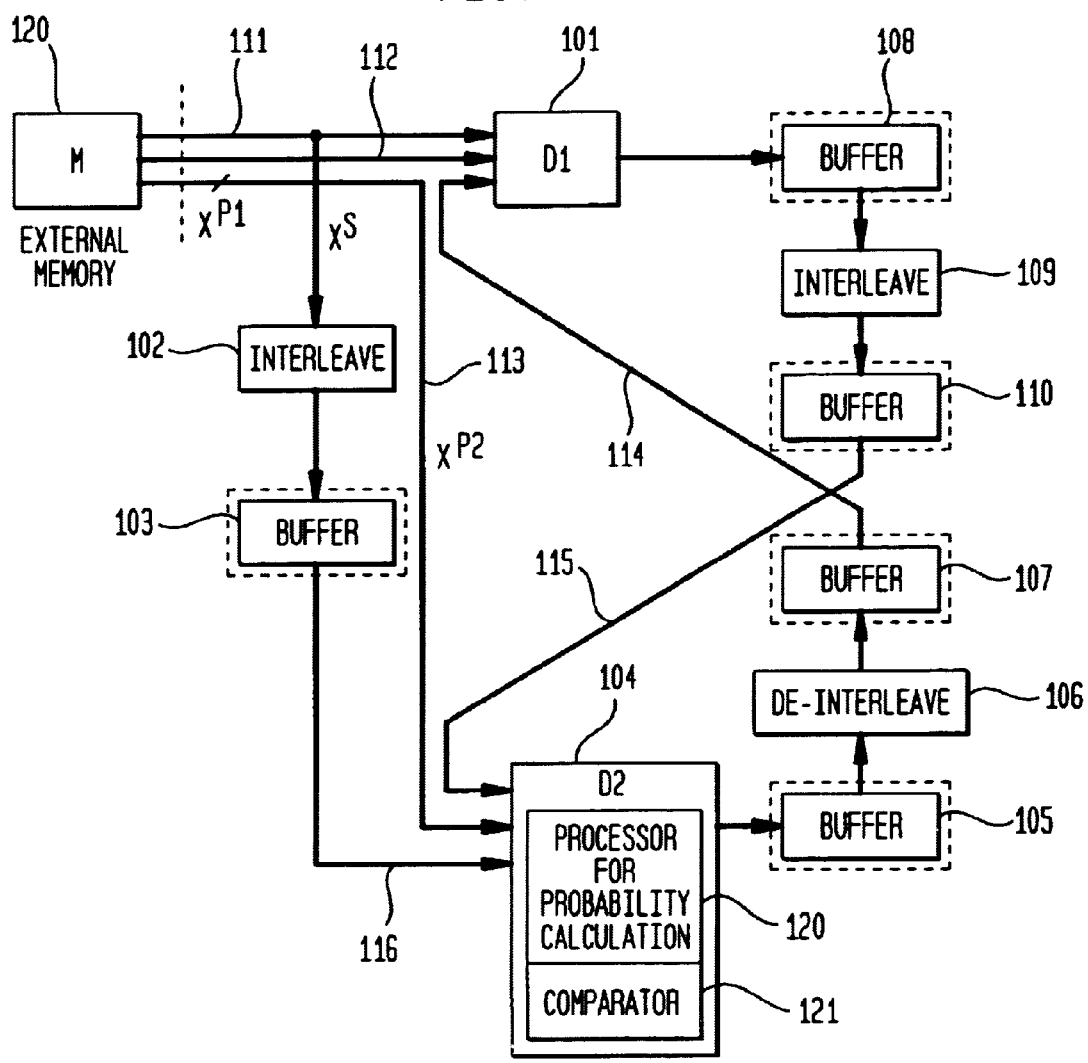
FIG. 1 shows an exemplary iterative decoder employing extrinsic information having a limited range of values in accordance with an exemplary embodiment of the present invention.

In accordance with exemplary embodiments of the present invention, an iterative decoder limits the range of extrinsic information used for iterative decoding of an encoded frame of data. FIG. 1 shows an iterative decoder employing a limited range of extrinsic information in accordance with an exemplary embodiment of the present invention. The iterative decoder of FIG. 1 may be employed in a turbo decoder operating in accordance with, for example, the CDMA-2000 standard. For the exemplary embodiment, the iterative decoder receives encoded data that is formed as follows. A frame of data is encoded with a first block code and a first parity bit $X^{P1}$ is added to the encoded frame of data. The frame of data is also interleaved with mapping f(*) and encoded with a second block code (which may be equivalent to the first block code), and a second parity bit $X^{P2}$ is added to the encoded frame of data. The encoded data is combined with the interleaved and encoded data to form a set of systematic bits $X^S$ (e.g., using a product code). As would be apparent to one skilled in the art, the techniques described herein are exemplary only and may be extended to other forms of iterative decoding of data encoded with other encoding methods.

The iterative decoder includes first and second decoders 101 and 104, interleavers 102 and 109 each applying the mapping f(*) to input data, de-interleaver 106 applying the inverse of the mapping f(*) to input data, and optional buffers 103, 105, 107, 108, and 110 used to temporarily store values during the decoding process. First and second decoders 101 and 104 apply respective decoding operations D1 (the inverse of the first block code) and D2 (the inverse of the second block code).

Iteration of the iterative decoder may be as follows. First decoder 101 receives systematic bits $X^S$ (via 111) and parity bits $X^{P1}$ (via 112) of the received frame from, for example, an external memory 120. First decoder 101 also receives extrinsic information (e.g., both the reliability values (soft-data representing values for the decoded frame of data) and extrinsic reliability values) generated by the second decoder 104 (via 114). For the exemplary embodiment, extrinsic information for one decoder may be derived from the de-interleaved, decoded frame of data from the other decoder and parity bits $X^{P1}$ and/or and parity bits $X^{P2}$ as described subsequently. For the first iteration, the extrinsic information provided to first decoder 101 may be initialized to zero. First decoder 101 performs decoding operation D1 on the systematic bits $X^S$ using the extrinsic information and parity bits $X^{P1}$ to generate soft-data. The soft data from first decoder 101 is then interleaved by interleaver 109, and the interleaved soft data is provided as extrinsic information for second decoder 104(via 115). Systematic bits $X^S$ are also interleaved by interleaver 102. Second decoder 104 receives the interleaved extrinsic information (via 115), the parity bits $X^{P2}$ (via 113) and the interleaved systematic bits $X^S$ (via 116), and performs decoding operation D2 to generate soft-data. The soft data from second decoder 104 is then de-interleaved by de-interleaver 106 and provided as the extrinsic information (via 114) for decoding the systematic bits $X^S$ in the next iteration by first decoder 101, thus ending a single iteration. Several iterations may be required to generate a decoded frame of data from the systematic bits $X^S$ and parity bits $X^{P1}$ and $X^{P2}$ to satisfy a predetermined threshold for bit error rate (BER) of the iterative decoder.

Figure 2:
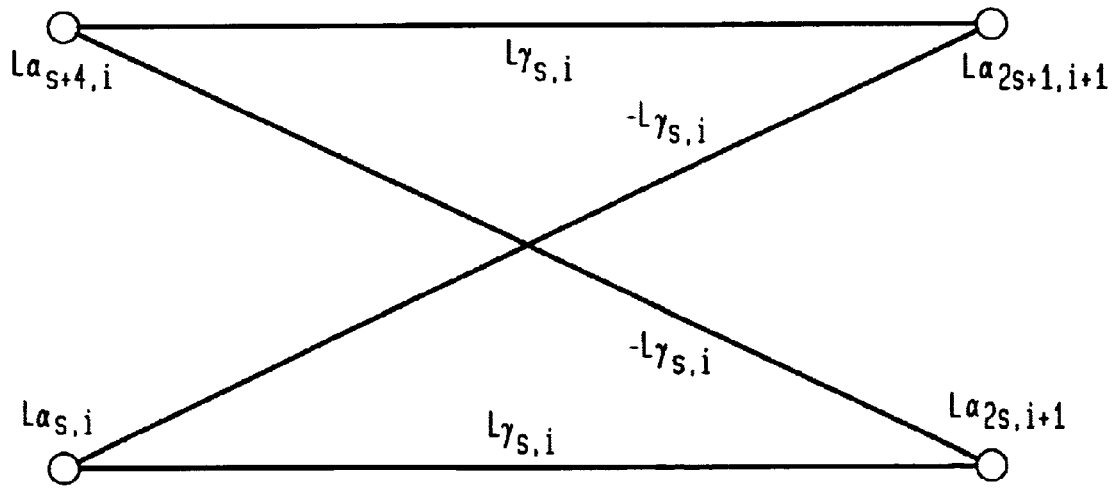
FIG. 2 shows a butterfly of the trellis employed in an a posteriori decoding method employed by the turbo decoder of FIG. 1.

Each of decoders 101 and 104 implements an APP (a posteriori probability) decoding algorithm well known in the art. The APP algorithm computes both forward probabilities a and the backward probabilities p for transitions between states (each state corresponding to a sequence of received values $L\alpha$ and $L\beta$ in the logarithm, respectively, when the logarithm is computed). As is known in the art, transitions between states may be represented by a state transition diagram with transitions between states, each state having an associated state metric and each transition having an associated branch metric. For the APP algorithm of decoders 101 and 104 of the exemplary turbo decoder of FIG. 1, the state transition diagram may be formed from a set of butterflies representing transitions between pairs of states. Quantities related to the probabilities for being in a state and the transitions to/from the state, such as state and branch metrics, respectively, are computed along the trellis that is associated with the convolutional codes used to encode the frame of data. FIG. 2 shows the butterfly of eight-state transition diagram going from a first state (shown as state 2s) to a second state (shown as state 2s+1) occurring between time intervals i and i+1. For an eight-state trellis, selecting the range $0 \leq s \leq 3$ allows all 8 states to be defined while reducing the size of, for example, a register or memory address pointer (i.e., s) used to calculate and store values of the transition diagram. Such eight-state transition diagram of FIG. 2 may be employed by the APP algorithms of first and second decoders 101 and 104 of FIG. 1. For the eight-state trellis, the value i is an arbitrary counter value that is monotonically increasing and may indicate, for example, the particular iteration of the decoding operation.

Equations (1a) and (1b) are expressions for computing updated logarithm state probabilities (i.e., state metrics $L\alpha$) using logarithm transition probabilities (i.e., branch metrics $L\gamma$) for the butterfly of FIG. 2:

$$L\alpha_{2s,i+1} = \log(e^{L\alpha_{s,i} + L\gamma_{s,i}} + e^{L\alpha_{s+4,i} - L\gamma_{s,i}}) \tag{1a}$$

$$L\alpha_{2s+1,i+1} = \log(e^{L\alpha_{s,i} - L\gamma_{s,i}} + e^{L\alpha_{s+4,i} + L\gamma_{s,i}}) \tag{1b}$$

The values of updated logarithm probabilities $L\beta$ are computed in a similar manner.

In equations (1a) and (1b), the extrinsic reliability value, $L_i^e$, of the extrinsic information may be included in the branch metric, $L\gamma_{s,i}$, as given in equation (2):

$$L\gamma_{s,i} = f_s(X_i^S, X_i^P) \pm L_i^e \tag{2}$$

where $f_s(X_i^S, X_i^P)$ is a linear combination of the systemic bits (or soft data reliability values) $X_i^S$ and the parity bits $X_i^P$ defined by the method employed to encode the frame of data (e.g., $X_i^P$ may be either of the parity bits $X_i^{P1}$ and $X_i^{P2}$ depending on which of the decoders (i.e., first and second decoders 101 or 104) implements the decoding operation (i.e., D1 or D2), and the sign of the extrinsic reliability value $L_i^e$ depends on the originating state (e.g., the value of s).

For a given implementation, the values of $X_i^S$ and $X_i^P$ may be represented by binary values having a fixed width, such as 8 bits. The binary representations may include a sign part, an integral part, and a fractional part. The values of the linear combination $f_s(X_i^S, X_i^P)$ may similarly be represented by binary values having a fixed width, such as 8 bits. The width required for values representing the extrinsic reliability values, $L_i^e$, which may also be represented by binary values, may change, however, during each iteration of the decoding process and with changing signal-to-noise ratio (SNR).

The extrinsic information includes an approximate measure of the probability that a particular transmitted bit received by the iterative decoder is a logic 0 or logic 1. The extrinsic information for the bit originates with one decoder and is used by the other decoder as external information about that bit. The ratio of the probability that a bit j is logic 0 to the probability that the bit j is a logic 1 is a measure of the confidence of a decision for a received bit matching the value of the transmitted bit. Using equations (1a), (1b), and (2), the ratio of the probability that a bit j is logic 0 to the probability that the bit j is a logic 1 may be approximated as given in equation (3):

$$10^{L\gamma \log 10 e} : 1 = 10^{0.4343 L_i e} : 1 \tag{3}$$

For typical exemplary implementations of a turbo decoder such as shown in FIG. 1, a predetermined bit error rate (BER) requirement for decoding a frame of data may be about $10^{-6}$, and may even be about $10^{-10}$. Consequently, the substantially high degree of confidence indicated by the ratio of equation (3) may not necessarily be required for decoding. The high degree of confidence may not be required since, if the desired maximum BER for decoding is $10^{-6}$, or even $10^{-10}$, the decision made for a transmitted bit is substantially the same with high confidence measures. For example, the decision made may be the same whether the decision is based a confidence measure of $10^{400}:1$ (when the value of $L_i^e$ is on the order of 1000) or $10^{50}:1$ (i.e., $L_i^e$ is on the order of 100). Therefore, the range of values for $L_i^e$ may be limited using saturation values defining the upper and lower bounds of the range. The saturation values are selected such that either no or relatively small degradation in BER occurs, and the saturation values also define the width of the binary representation of the saturation value.

Returning to FIG. 1, each of first and second decoders 101 and 104 calculates the transition probabilities and compares the calculated extrinsic information with the saturation value. For example, as shown in second decoder 104, a processor such as processor 120 may be employed to calculate transition probabilities and extrinsic information, and may include comparator circuit 121 to detect when calculated extrinsic information exceeds a saturation value.

Figure 3:
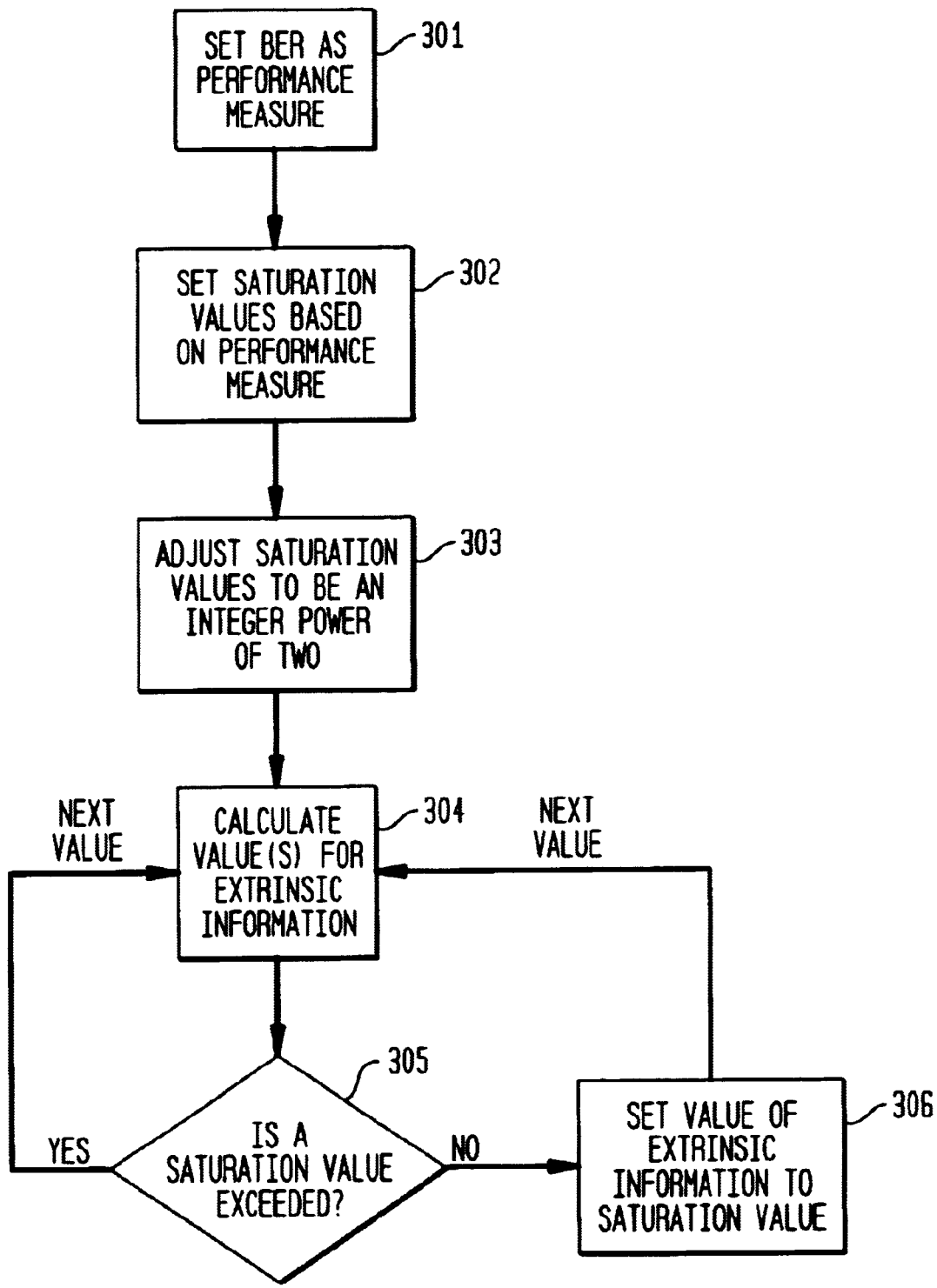
FIG. 3 shows a flow diagram of an exemplary method of limiting the range of extrinsic information values.

FIG. 3 shows a flow diagram of an exemplary method of limiting the range of extrinsic information values. At step 301, a BER threshold is set for iterative decoding. The BER threshold may be a predetermined level or standard requirement, or it may be determined dynamically between a transmitter and receiver based on channel measurements if variable coding is used. At step 302, saturation values are set for the extrinsic values such that decoding maintains the maximum BER of a decoded frame of data. The saturation values may be set such that the magnitude of the saturation has a relative minimum value, and the saturation values may be fixed or variable. Fixed saturation values may be employed to simplify design of memory or arithmetic operator storage width. Variable saturation values may be employed when either the BER threshold is allowed to vary or for limiting the width of arithmetic operations to conserve power consumption. Optionally, at step 303, the saturation values of step 302 are adjusted to be an integer power of two while maintaining the BER threshold. At step 304, the extrinsic information value is calculated as described previously with respect to FIG. 1. At step 305, a test determines whether the calculated extrinsic information value meets or exceeds the corresponding saturation value. If the test of step 305 determines that the calculated extrinsic information value exceeds the corresponding saturation value, the extrinsic information value is set to the corresponding saturation value at step 306. From step 306, the method then returns to step 304 to calculate the next extrinsic information value . Otherwise, from step 305, the method returns to step 304 to calculate the next extrinsic information value.

For the exemplary implementation of the turbo decoder shown in FIG. 1, since the quantity $L_i^e/2$ may be used during arithmetic operations rather than $L_i^e$, only 10 bits need to be used to store $L_i^e/2$. Therefore, the width of a binary representation of $L_i^e/2$ may be limited to 11 bits, of which 3 bits are used for the fractional part and one bit for the sign. The calculated value of $L_i^e$ may be compared to the corresponding saturation values −128 and 127.75 to determine when the saturation value is met or exceeded. When the saturation value is met or exceeded, the value of $L_i^e$ is then set to the saturation value. For such exemplary implementation, having values of $L_i^e$ ranging between −128 and 127.75, values that are calculated outside of the range are set as one of the two end values, depending on the direction of overflow. This range of values for $L_i^e$ corresponds to the confidence measure of equation (3) ranging from $10^{55.5}:1$ to $10^{-55.5}:1$, resulting in little or no BER degradation. The choice of the saturation thresholds that are an integer power of two also allows for relatively easy detection of register overflow (calculated values exceeding the saturation value) by examining changes in the most significant bit (ignoring the sign bit). For values of $L_i^e$ ranging between −128 and 127.75, these saturation values correspond to all bits logic 0 and all bits logic 1, respectively. Such detection may be accomplished by monitoring the register's most significant bit change from logic 0 to logic 1, then back to logic 0 when the register overflows.

For an exemplary implementation of a turbo decoder of the prior art implementing decoding algorithms similar to those employed in the exemplary turbo decoder of FIG. 1, the amplitude of $L_i^e$ may exceed 1000 after a number of iterations with high signal-to-noise ratio (SNR). With a magnitude of $L_i^e$ of at least 1000, equation (3) gives a ratio of $10^{434.3}:1$ as a confidence measure. Consequently, the binary representation of the amplitude of $L_i^e$ that exceeds 1000 may require 10 bits or more to represent its integral part. Allocating one bit for the sign and three bits to represent the fractional part of the amplitude of $L_i^e$, at least 14 bits are needed to represent a signed, binary value of the extrinsic reliability value $L_i^e$. Since the value of $L_i^e$ is used to calculate the values for $L\gamma$ and ultimately $L\alpha$ (or $L\beta$), more than 16 bits may be required to represent each value of $L\alpha$. In addition, if the buffer storing the value of $L\gamma_{s,i}$ overflows, the entire frame of data may be incorrectly decoded by the iterative decoder.

In contrast, an exemplary implementation of a turbo decoder such as shown in FIG. 1 employing a limited range of values for extrinsic information may provide the following advantages over the prior art decoder. A first advantage is that power consumption of, for example, an implementation of the circuit within an integrated circuit may be reduced. With saturation values set so as to limit the width of the extrinsic reliability values to 11 bits, 14 bits may be employed to represent values of $L\alpha$ and $L\beta$. The power consumption may thus be reduced by at least (16−14)/16 (assuming that 16-bit arithmetic is used in the prior art decoder)=12.5%. Moreover, with a two-bit based normalization scheme, almost all arithmetic operations for calculating values of $L\alpha$ and $L\beta$ may require less than 13 bits. For these calculations, power consumption may be reduced by (16−13)/16=18.75%. As would be apparent to one skilled in the art, implementations for computing the branch metric $L\gamma$ may also have reduced power consumption.

A second advantage is that the size (e.g., layout area of an integrated circuit) of a particular turbo decoder implementation may be reduced. The size may be reduced by 12.5% for circuits calculating values for $L\alpha$ and $L\beta$. In addition, storage of the extrinsic information (in buffers or other forms of memory) may be 10 bits wide instead of the standard 16-bit width employed in the prior art, resulting in a memory size reduction of more than 37.5%. A third advantage is that the internal arithmetic operations may be constrained so as to limit or prevent overflow.

While the exemplary embodiments of the present invention have been described with respect to processes of circuits, the present invention is not so limited. As would be apparent to one skilled in the art, various functions of circuit elements may also be implemented in the digital domain as processing steps in a software program. Such software may be employed in, for example, a digital signal processor, micro-controller or general purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. In a signal processing application, a method of iterative decoding of an encoded frame of data, the method comprising the steps of:

(a) performing, in an iteration, a first decoding of the encoded frame of data during which extrinsic information is calculated;

(b) comparing the value of the extrinsic information to a saturation value, wherein the saturation value defines a bound for a range of the values for the extrinsic information based on a confidence measure while maintaining a performance measure for iterative decoding; and (c) setting, based on the comparison, the value of the extrinsic information to either 1) the value of the calculated extrinsic information or 2) a value related to the saturation value exceeded if the value of the extrinsic information exceeds the saturation value.

2. The invention as recited in claim 1, further comprising the step of (d) performing a second decoding in the iteration with the extrinsic information set in step (c).

3. The invention as recited in claim 2, further comprising the step of (e) repeating steps (a) through (d) for one or more subsequent iterations.

4. The invention as recited in claim 2, wherein, for step (b), the saturation value may vary to maintain a performance measure for iterative decoding when a threshold for the performance measure is allowed to vary.

5. The invention as recited in claim 1, wherein, for step (b), the saturation value is an integer power of two.

6. The invention as recited in claim 1, wherein the method is implemented by a processor embodied in an integrated circuit.

7. The invention as recited in claim 1, wherein the method is implemented by an iterative decoder operating in accordance with a code-division, multiple access communication system.

8. An iterative decoder including a circuit for generating a value of extrinsic information for iterative decoding of an encoded frame of data, the circuit comprising:

a processing module performing, in an iteration, a first decoding of the encoded frame of data during which extrinsic information is calculated; and a comparator comparing the value of the extrinsic information to a saturation value, wherein the saturation value defines a bound for a range of the values for the extrinsic information based on a confidence measure while maintaining a performance measure for iterative decoding, and wherein the value of the extrinsic information is set to either 1) the value of the calculated extrinsic information or 2) a value related to the saturation value exceeded if the value of the extrinsic information exceeds the saturation value.

9. The invention as recited in claim 8, wherein the processing module further performs a second decoding in the iteration with the extrinsic information of the first decoding.

10. The invention as recited in claim 9, wherein the iterative decoder implements one or more subsequent iterations.

11. The invention as recited in claim 9, wherein the saturation value may vary to maintain a performance measure for iterative decoding when a threshold for the performance measure is allowed to vary.

12. The invention as recited in claim 8, wherein the saturation value is an integer power of two.

13. The invention as recited in claim 8, wherein the iterative decoder is embodied in an integrated circuit.

14. The invention as recited in 8, wherein the iterative decoder operates in accordance with a code-division, multiple access communication system.

15. In a signal processing application, an iterative decoder in which a width of a storage medium for a binary representation for a value of extrinsic information employed in the iterative decoder decoding a frame of encoded data is set by the steps of:

(a) generating a bit error rate for decoding the frame of encoded data, the bit error rate defining a performance measure of the iterative decoder;

(b) generating a ratio of the probability that a bit of the frame is logic 0 and the probability that the bit is a logic 1, the ratio defining a confidence measure; and (c) setting a pair of saturation values based on the confidence measure while maintaining the performance measure, the pair of saturation values defining an upper bound and a lower bound for the value of the extrinsic information, wherein the width of the binary representation is set based on the pair of saturation values.

16. A computer-readable medium having stored thereon a plurality of instructions, the plurality of instructions including instructions which, when executed by a processor, cause the processor to implement a method for iterative decoding of an encoded frame of data, the method comprising the steps of:

(a) performing, in an iteration, a first decoding of the encoded frame of data during which extrinsic information is calculated;

(b) comparing the value of the extrinsic information to a saturation value, wherein the saturation value defines a bound for a range of the values for the extrinsic information based on a confidence measure while maintaining a performance measure for iterative decoding; and (c) setting, based on the comparison, the value of the extrinsic information to either 1) the value of the calculated extrinsic information or 2) a value related to the saturation value exceeded if the value of the extrinsic information exceeds the saturation value.

* * * * *